US008473247B2

(12) United States Patent
Cruse et al.

(10) Patent No.: US 8,473,247 B2
(45) Date of Patent: Jun. 25, 2013

(54) METHODS FOR MONITORING PROCESSING EQUIPMENT

(75) Inventors: James P. Cruse, Santa Cruz, CA (US); Dermot Cantwell, Sunnyvale, CA (US); Michael R. Rice, Pleasanton, CA (US); Thorsten Kril, Santa Clara, CA (US); Charles Hardy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 12/915,260

(22) Filed: Oct. 29, 2010

(65) Prior Publication Data

US 2011/0270574 A1 Nov. 3, 2011

Related U.S. Application Data

(60) Provisional application No. 61/330,077, filed on Apr. 30, 2010.

(51) Int. Cl.
*G04F 1/00* (2006.01)
*G04F 3/00* (2006.01)
*G04F 5/00* (2006.01)
*G04F 7/00* (2006.01)
*G04F 8/00* (2006.01)
*G04F 10/00* (2006.01)
*G04G 5/00* (2006.01)
*G04G 7/00* (2006.01)
*G40G 15/00* (2006.01)

(52) U.S. Cl.
USPC ........................................................ 702/176

(58) Field of Classification Search
USPC 702/79, 108, 176, 182, 183; 438/14; 700/108
See application file for complete search history.

(56) References Cited

U.S. PATENT DOCUMENTS

| 6,112,225 | A | * | 8/2000 | Kraft et al. ................... 709/202 |
| 7,587,296 | B2 | | 9/2009 | Harvey, Jr. et al. |
| 8,024,705 | B2 | * | 9/2011 | Hughes et al. ................ 717/124 |
| 2005/0055175 | A1 | | 3/2005 | Jahns et al. |
| 2006/0009871 | A1 | | 1/2006 | Ji et al. |
| 2006/0157698 | A1 | | 7/2006 | Miyajima |
| 2006/0176928 | A1 | | 8/2006 | Nakamura et al. |
| 2009/0112520 | A1 | * | 4/2009 | Lymberopoulos et al. ... 702/184 |

OTHER PUBLICATIONS

International Search Report and Written Opinion mailed Dec. 28, 2011 for PCT Application No. PCT/US2011/032864.

* cited by examiner

*Primary Examiner* — Michael Nghiem
*Assistant Examiner* — Manuel Rivera Vargas
(74) *Attorney, Agent, or Firm* — Moser Taboada; Alan Taboada

(57) ABSTRACT

Methods for monitoring processing equipment are provided herein. In some embodiments, a method for monitoring processing equipment when in an idle state for a period of idle time may include selecting a test from a list of a plurality of tests to perform on the processing equipment when the processing equipment is in the idle state, wherein the test has a total run time; starting the selected test; comparing a remaining idle time of the period of idle time to a remaining run time of the total run time as the selected test is performed; and determining whether to end the selected test prior to completing the total run time in response to the comparison.

20 Claims, 4 Drawing Sheets

METHODS FOR MONITORING PROCESSING EQUIPMENT

CROSS-REFERENCE TO RELATED APPLICATIONS

This application claims benefit of U.S. provisional patent application Ser. No. 61/330,077, filed Apr. 30, 2010, which is herein incorporated by reference.

FIELD

Embodiments of the present invention generally relate to substrate processing equipment.

BACKGROUND

Conventional substrate fabrication typically includes a multi-step sequence, wherein each step comprises one or more processes that may be performed in one or more process chambers. The process chambers may be standalone process chambers or part of a cluster tool—for example, coupled to a processing system having various processing equipment, such as a shared transfer chamber, load lock chamber or factory interface. The processing equipment typically has periodic maintenance performed to maintain the processing equipment in condition for providing satisfactory processing results. For example, a series of tests may be conducted on the processing equipment according to a predetermined schedule to determine if any maintenance is necessary. However, in conventional systems, the processing equipment is often taken offline when performing one or more of the tests. The equipment downtime required to run the tests reduce the amount of time the processing equipment is available for substrate fabrication, thus decreasing efficiency and increasing cost of ownership.

Therefore the inventors have provided improved methods for monitoring processing equipment.

SUMMARY

Methods for monitoring processing equipment are provided herein. In some embodiments, a method for monitoring processing equipment when in an idle state for a period of idle time may include selecting a test from a list of a plurality of tests to perform on the processing equipment when the processing equipment is in the idle state, wherein the test has a total run time; starting the selected test; comparing a remaining idle time of the period of idle time to a remaining run time of the total run time as the selected test is performed; and determining whether to end the selected test prior to completing the total run time in response to the comparison.

In some embodiments, a method for monitoring processing equipment may include performing, in order, (a) waiting for and processing incoming substrates in a process chamber; (b) if the process chamber is not currently running any substrates or performing any preliminary or post substrate processing, then determining whether there are any substrates to be processed in the process chamber; (c) if there are substrates to be processed in the process chamber, then returning to (a); (d) if there are no substrates to be processed in the process chamber, then upon determining if an idle time of the first process chamber is below a minimum idle time before test start or if there are no tests that are due to run, then returning to (b); (e) if there are no substrates to be processed in the process chamber, then, if an idle time of the process chamber is above a minimum idle time before a test start time, determining that the process chamber is idle and tests can be run; (f) selecting and starting a test selected from a list of a plurality of tests to perform on the process chamber when the process chamber is in an idle state for a period of time; (g) if there are substrates to process and the test is interruptible, then interrupting the test and returning to (a); (h) if there are substrates to process and the test is not interruptible, or if there are no substrates to process, then finishing the test; and (i) upon finishing the test, returning to (c).

In some embodiments, a computer readable medium may be provided, having instructions stored thereon which, when executed, causes a controller to perform a method for monitoring processing equipment. In some embodiments, the method may include any of the methods described herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
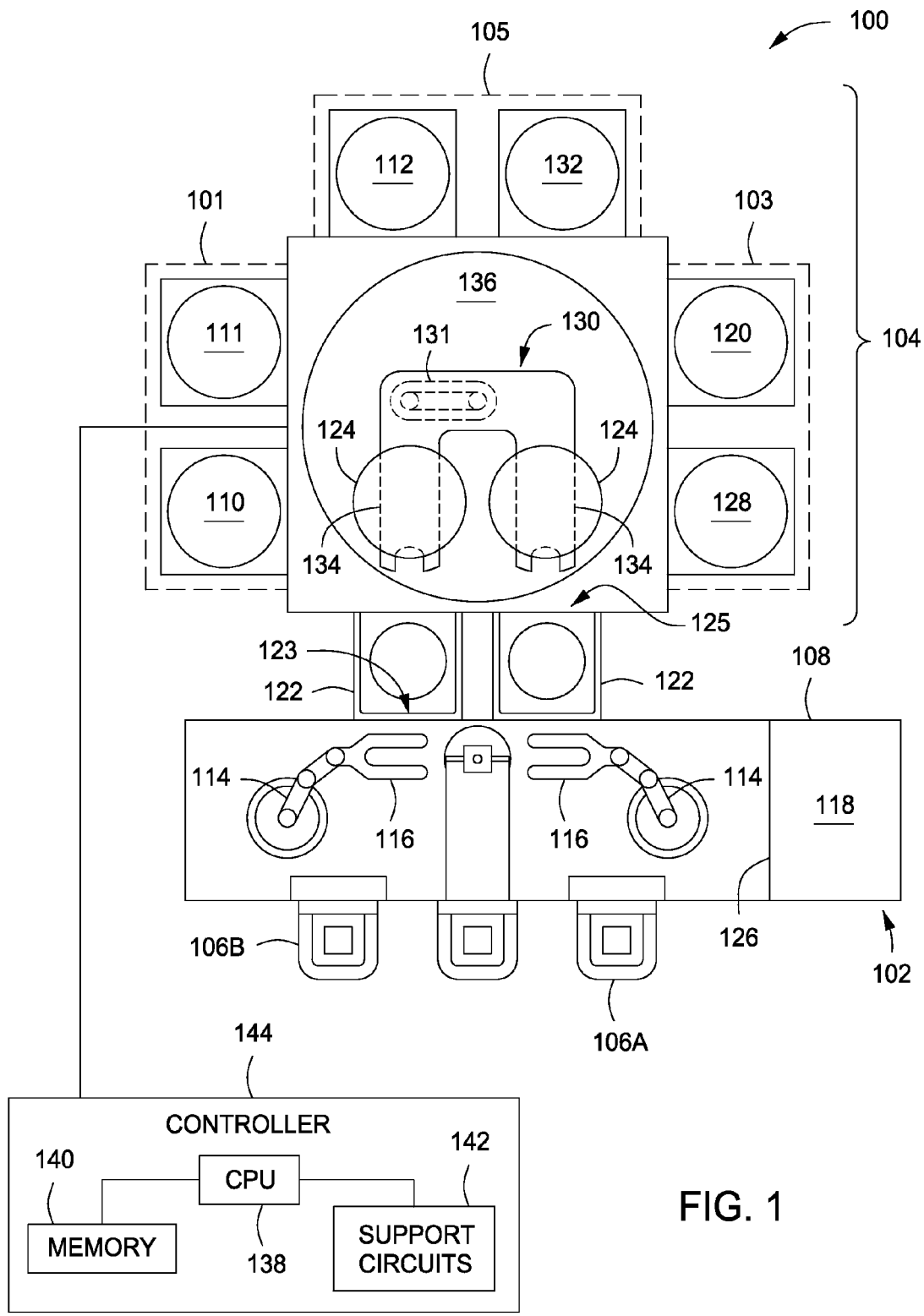
FIG. 1 depicts an exemplary processing system suitable for performing a method for monitoring processing equipment in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for monitoring processing equipment. The inventive methods may be utilized to monitor any type of equipment, for example semiconductor processing equipment such as described below with respect to FIGS. 1 and 2. The methods may be stored in the memory of a controller configured to control the equipment being monitored and may be run automatically or be manually initiated. The inventive methods advantageously provide for monitoring of processing equipment during process equipment idle time using interruptible tests that may be terminated when the processing equipment is ready to process substrates, thereby reducing downtime and increasing the efficiency of the processing equipment.

The methods of the present invention may be more easily understood with reference to examples of substrate processing equipment suitable for use with the inventive methods. Referring to FIG. 1, in some embodiments, a processing system 100 suitable for use with the inventive methods may generally comprise a vacuum-tight processing platform 104, a factory interface 102, and a system controller 144. Examples of processing systems that may be suitably modified in accordance with the teachings provided herein include the Centura® integrated processing system, one of the PRODUCER® line of processing systems (such as the PRODUCER® GT™), ADVANTEDGE™ processing systems, or other suitable processing systems commercially available from Applied Materials, Inc., located in Santa Clara, Calif. It is contemplated that other processing systems (including those from other manufacturers) may be adapted to benefit from the invention.

The platform 104 may include a plurality of processing chambers (six shown) 110, 111, 112, 132, 128, 120 and at least one load-lock chamber (two shown) 122 that are coupled to a transfer chamber 136. Each process chamber includes a slit valve or other selectively sealable opening to selectively fluidly couple the respective inner volumes of the process chambers to the inner volume of the transfer chamber 136. Similarly, each load lock chamber 122 includes a port 125 to selectively fluidly couple the respective inner volumes of the load lock chambers 122 to the inner volume of the transfer chamber 136. The factory interface 102 is coupled to the transfer chamber 136 via the load lock chambers 122.

In some embodiments, for example, as depicted in FIG. 1, the processing chambers 110, 111, 112, 132, 128, 120 may be grouped in pairs with each of the processing chambers 110, 111, 112, 132, 128, 120 in each pair positioned adjacent to one another. In some embodiments, each pair of process chambers may be part of a twin chamber processing system (101, 103, 105) where each respective pair of process chambers may be provided in a common housing with certain shared resources provided, as discussed herein. Each twin chamber processing system 101, 103, 105 may include a pair of independent processing volumes that may be isolated from each other. For example, each twin chamber processing system may include a first process chamber and a second process chamber, having respective first and second processing volumes. The first and second processing volumes may be isolated from each other to facilitate substantially independent processing of substrates in each respective process chamber. The isolated processing volumes of the process chambers within the twin chamber processing system advantageously reduces or eliminates processing problems that may arise due to multi-substrate processing systems where the processing volumes are fluidly coupled during processing.

In addition, the twin chamber processing system further advantageously utilizes shared resources that facilitate reduced system footprint, hardware expense, utilities usage and cost, maintenance, and the like, while at the same time promoting higher substrate throughput. For example, as shown in FIG. 1, the processing chambers may be configured such that certain processing resources (e.g., process gas supply, power supply, or the like) may be shared between each of the process chambers 110, 111, 112, 132, 128, 120 or within each pair of process chambers within that respective pair. Other examples of shared hardware and/or resources may include one or more of a process foreline and roughing pump, AC distribution and DC power supplies, cooling water distribution, chillers, multi-channel thermo controllers, gas panels, controllers, and the like.

In some embodiments, the factory interface 102 includes at least one docking station 108 and at least one factory interface robot (two shown) 114 to facilitate transfer of substrates. The docking station 108 is configured to accept one or more (two shown) front opening unified pods (FOUPs) 106A-B. In some embodiments, the factory interface robot 114 generally comprises a blade 116 disposed on one end of the robot 114 configured to transfer the substrate from the factory interface 102 to the processing platform 104 for processing through the load lock chambers 122. Optionally, one or more metrology stations 118 may be connected to a terminal 126 of the factory interface 102 to facilitate measurement of the substrate from the FOUPs 106A-B.

In some embodiments, each of the load lock chambers 122 may comprise a first port 123 coupled to the factory interface 102 and a second port 125 coupled to the transfer chamber 136. The load lock chambers 122 may be coupled to a pressure control system which pumps down and vents the load lock chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 generally includes one or more transfer blades (two shown) 134 coupled to a movable arm 131. In some embodiments, for example where the processing chambers 110, 111, 112, 132, 128, 120 are arranged in groups of two as depicted FIG. 1, the vacuum robot 130 may have two parallel transfer blades 134 configured such that the vacuum robot 130 may simultaneously transfer two substrates 124 from the load lock chambers 122 to the processing chambers 110, 111, 112, 132, 128, 120.

The processing chambers 110, 111, 112, 132, 128, 120 may be any type of process chamber utilized in substrate processing. In some embodiments, at least one of the processing chambers 110, 111, 112, 132, 128, 120 may be an etch chamber, deposition chamber, or the like. For example, in embodiments where at least one of the processing chambers 110, 111, 112, 132, 128, 120 is an etch chamber, the at least one of the processing chamber 110, 111, 112, 132, 128, 120 may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, or in combination, in some embodiments, at least one of the process chambers 110, 111, 112, 132, 128, 120 may be one of a HART™, E-MAX®, DPS®, DPS II, or ENABLER® etch chamber also available from Applied Materials, Inc. In some embodiments, one or more of the process chambers 110, 111, 112, 132, 128, 120 may be similar to the process chambers described below with respect to FIG. 2. Other etch chambers, including those from other manufacturers, may be utilized.

The system controller 144 is coupled to the processing system 100. The system controller 144 may control the operation of the system 100 using a direct control of the process chambers 110, 111, 112, 132, 128, 120 of the system 100 or alternatively, by controlling the computers (or controllers) associated with the process chambers 110, 111, 112, 132, 128, 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. To facilitate control of the processing system 100, the system controller 144 may be one of any form of general-purpose computer processor that can be used in an industrial setting for controlling various chambers and sub-processors. The memory, or computer-readable medium, 140 of the CPU 138 may be one or more of readily available memory such as random access memory (RAM), read only memory (ROM), floppy disk, hard disk, or any other form of digital storage, local or remote. The support circuits 142 are coupled to the CPU 138 for supporting the processor in a conventional manner. These circuits include cache, power supplies, clock circuits, input/output circuitry and subsystems, and the like.

The inventive methods disclosed herein may generally be stored in the memory 140 as a software routine that, when executed by the CPU 138, causes the system controller 144 to perform processes of the present invention. The software routine may also be stored and/or executed by a second CPU (not shown) that is remotely located from the hardware being controlled by the CPU 138. Some or all of the methods of the present invention may also be performed in hardware. As such, the invention may be implemented in software and executed using a computer system, in hardware as, e.g., an application specific integrated circuit or other type of hardware implementation, or as a combination of software and hardware. The software routine, when executed by the CPU 138, transforms the general purpose computer into a specific purpose computer (controller) 144 that controls the chamber operation such that the methods disclosed herein are performed.

Figure 2:
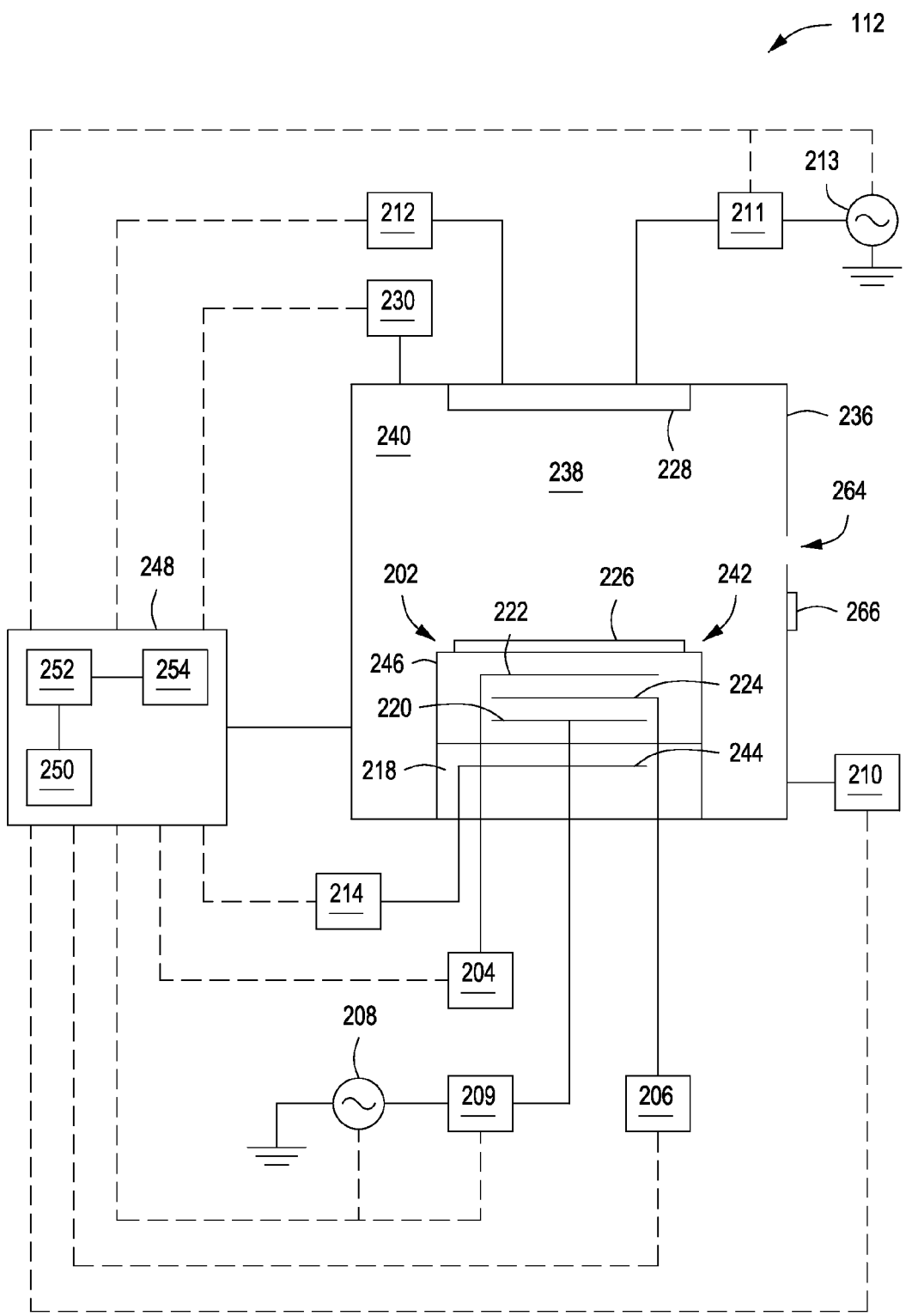
FIG. 2 depicts an exemplary process chamber suitable for performing a method for monitoring processing equipment in accordance with some embodiments of the present invention.

FIG. 2 depicts an exemplary process chamber 112 suitable for performing methods for monitoring processing equipment in accordance with some embodiments of the present invention. The process chamber 112 may be part of a cluster tool, such as processing system 100, or may be a standalone process chamber.

The process chamber 112 may be any type of process chamber, for example, such as any of the process chambers described above with respect to FIG. 1. In some embodiments, the process chamber 112 may generally comprise a chamber body 236 defining an inner volume 240 that may include a processing volume 238. The processing volume 238 may be defined, for example, between a substrate support pedestal 202 disposed within the process chamber 112 for supporting a substrate 226 thereupon during processing and one or more gas inlets, such as a showerhead 228 and/or nozzles provided at desired locations.

In some embodiments, the substrate support pedestal 202 may include a mechanism that retains or supports the substrate 226 on the surface 242 of the substrate support pedestal 202, such as an electrostatic chuck, a vacuum chuck, a substrate retaining clamp, or the like. For example, in some embodiments, the substrate support pedestal 202 may include a chucking electrode 224 disposed within an electrostatic chuck 246. The chucking electrode 224 may be coupled to one or more chucking power sources (one shown) 206 through one or more respective matching networks (not shown). The one or more chucking power source 206 may be capable of producing up to 12,000 W at a frequency of about 2 MHz, or about 13.56 MHz, or about 60 Mhz. In some embodiments, the one or more chucking power source 206 may provide either continuous or pulsed power. In some embodiments, the chucking power source may be a DC or pulsed DC source.

In some embodiments, the substrate support 202 may include one or more mechanisms for controlling the temperature of the substrate support surface 242 and the substrate 226 disposed thereon. For example, a one or more channels 244 may be provided to define one or more flow paths beneath the substrate support surface 242 to flow a heat transfer fluid. The one or more channels 244 may be configured in any manner suitable to provide adequate control over temperature profile across the substrate support surface 242 and the substrate 226 disposed thereon during processing. In some embodiments, the one or more channels 244 may be disposed within a cooling plate 218. In some embodiments, the cooling plate 218 may be disposed beneath the electrostatic chuck 246.

In some embodiments, the heat transfer fluid may comprise any fluid suitable to provide adequate transfer of heat to or from the substrate 226. For example, the heat transfer fluid may be a gas, such as helium (He), oxygen ($O_2$), or the like, or a liquid, such as water, antifreeze, or an alcohol, for example, glycerol, ethylene glycerol, propylene, methanol, or the like. The heat transfer fluid may be supplied by a heat transfer fluid source 214.

In some embodiments, one or more heaters (one shown) 222 may be disposed proximate the substrate support 202 to further facilitate control over the temperature of the substrate support surface 242. The one or more heaters 222 may be any type of heater suitable to provide control over the substrate temperature. For example, the one or more heaters 222 may be one or more resistive heaters. In such embodiments, the one or more heaters 222 may be coupled to a power source 204 configured to provide the one or more heaters 222 with power to facilitate heating the one or more heaters 222. In some embodiments the heaters may be disposed above or proximate to the substrate support surface 242. Alternatively, or in combination, in some embodiments, the heaters may be embedded within the substrate support 202 or the electrostatic chuck 246. The number and arrangement of the one or more heaters may be varied to provide additional control over the temperature of the substrate 226. For example, in embodiments where more than one heater is utilized, the heaters may be arranged in a plurality of zones to facilitate control over the temperature across the substrate 226, thus providing increased temperature control.

The substrate 226 may enter the process chamber 112, 132 via an opening 264 in a wall of the process chamber 112, 132. The opening 264 may be selectively sealed via a slit valve 266, or other mechanism for selectively providing access to the interior of the chamber through the opening 264. The substrate support pedestal 202 may be coupled to a lift mechanism (not shown) that may control the position of the substrate support pedestal 202 between a lower position suitable for transferring substrates into and out of the chamber via the opening 264 and a selectable upper position suitable for processing. The process position may be selected to maximize process uniformity for a particular process. When in at least one of the elevated processing positions, the substrate support pedestal 202 may be disposed above the opening 264 to provide a symmetrical processing region.

The one or more gas inlets (e.g., the showerhead 228) may be coupled to a gas supply 212 for providing one or more process gases into the processing volume 238 of the process chambers 112. Although a showerhead 228 is shown in FIG. 2, additional or alternative gas inlets may be provided such as nozzles or inlets disposed in the ceiling or on the sidewalls of the process chambers 112 or at other locations suitable for providing gases as desired to the process chambers 112, such as the base of the process chamber, the periphery of the substrate support pedestal, or the like.

In some embodiments, the process chambers 112 may utilize capacitively coupled RF power for plasma processing, although the process chambers 112 may also or alternatively use inductive coupling of RF power for plasma processing. For example, the substrate support 202 may comprise an electrode 220 coupled to one or more plasma power sources (one RF power source 208 shown) through one or more respective matching networks 209. In some embodiments, for example where the substrate support 202 is fabricated from a conductive material (e.g., a metal such as aluminum) the entire substrate support 202 may function as an electrode, thereby eliminating the need for a separate electrode 220. Alternatively, or in combination, in some embodiments, the showerhead 228 may function as, or include an electrode having a plasma power source 213 coupled thereto via a matching network 211, for example, for striking a plasma in the first processing volume 208 from a process gas. The one or more plasma power sources may be capable of producing up to about 5,000 W at a frequency of about 2 MHz and or about 13.56 MHz or high frequency, such as 27 MHz and/or 60 MHz.

In some embodiments, an endpoint detection system 230 may be coupled to the process chamber 112 and used to determine when a desired endpoint of a process is reached. For example, the endpoint detection system 230 may be one or more of an optical spectrometer, a mass spectrometer, or any suitable detection system for determining the endpoint of a process being performed within the processing volume 238. In some embodiments, the endpoint detection system 230 may be coupled to a controller 248 of the process chamber 112.

In some embodiments, a vacuum pump 210 may be coupled to the pumping plenum via a pumping port for pumping out the exhaust gases from the process chambers 112. The vacuum pump 210 may be fluidly coupled to an exhaust outlet for routing the exhaust as required to appropriate exhaust handling equipment. A valve (such as a gate valve or the like) may be disposed in the pumping plenum to facilitate control of the flow rate of the exhaust gases in combination with the operation of the vacuum pump 210.

To facilitate control of the process chambers 112, the controller 248 may be one of any form of general-purpose computer processor that can be used in an industrial setting for controlling various chambers and sub-processors. The memory, or computer-readable medium, 250 of the CPU 252 may be one or more of readily available memory such as random access memory (RAM), read only memory (ROM), floppy disk, hard disk, or any other form of digital storage, local or remote. The support circuits 254 are coupled to the CPU 252 for supporting the processor in a conventional manner. These circuits include cache, power supplies, clock circuits, input/output circuitry and subsystems, and the like. The controller 248 may be coupled to the process chamber 112 to control function thereof. In addition, the controller 248 may be coupled separately to the various parts of the process chamber 112, for example, the gas supply 230, plasma power source 238, vacuum pump 210, gas supply 212, endpoint detection system 230, or the like to control function thereof. Alternatively, or in combination, in some embodiments, the controller 248 may perform the inventive methods described below on the process chamber 112 and the various parts as described above.

The inventive methods disclosed herein may generally be stored in the memory 250 as a software routine that, when executed by the CPU 252, causes the process chambers 112 to perform processes of the present invention. The software routine may also be stored and/or executed by a second CPU (not shown) that is remotely located from the hardware being controlled by the CPU 252. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine, when executed by the CPU 252, transforms the general purpose computer into a specific purpose computer (controller) 248 that controls the chamber operation such that the methods disclosed herein are performed.

In order keep the processing equipment running optimally, and/or to prevent unexpected downtime due to equipment failure, methods of the present invention may facilitate monitoring process equipment without impacting, or minimally impacting, production while simultaneously running optimum maintenance services (also referred to herein as one or more tests). For example, embodiments of the present invention provide interruptible services that can be run when the tool is in an idle state (e.g., upon entering an idle state or when in an idle state for a period of time, for example, 2 or 5 minutes) and which can be terminated upon a desire to return the tool to a production state—such as when a new substrate or new lot of substrates arrives at the process equipment—thereby minimizing any impact on productivity.

Figure 3:
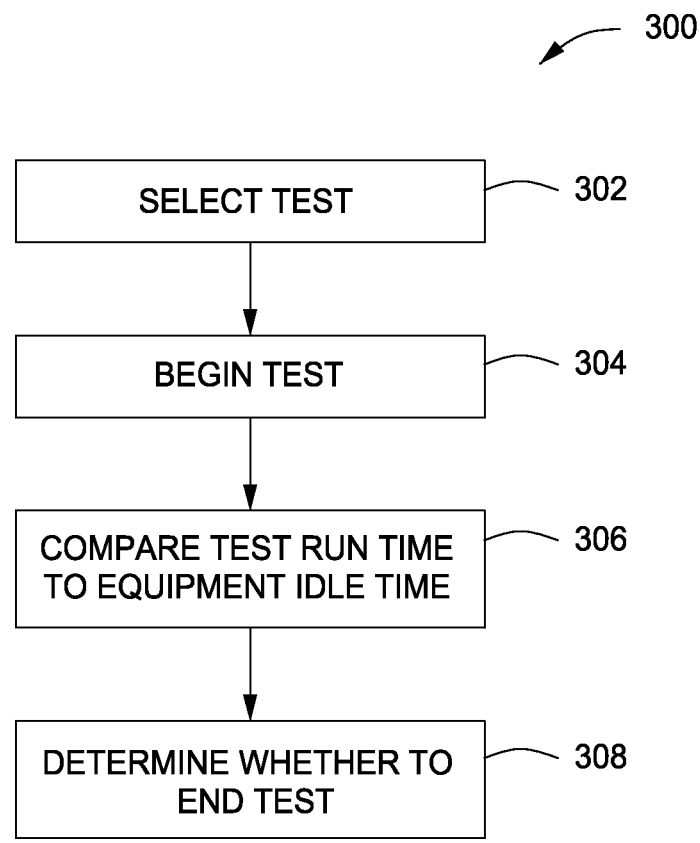
FIGS. 3-4 depict a method a method for monitoring processing equipment in accordance with some embodiments of the present invention.

FIG. 3 depicts a method 300 for monitoring processing equipment in accordance with some embodiments of the present invention. In some embodiments, the method 300 may be stored in memory of a controller of one or more pieces of processing equipment. The method 300 may be manually initiated, or can be configured to run automatically, thereby eliminating the need for user input or manual initiation. The method 300 may be performed to monitor any type of processing equipment, for example any part of a substrate processing system, such as a process chamber, cluster tool, load lock chamber, transfer chamber, or the like. In some embodiments, the method 300 may be utilized to monitor one or more parts of the processing system 100 or process chamber 112 described above with respect to FIGS. 1 and 2, respectively.

The method 300 may be performed at any time the processing equipment to be monitored is in an idle state (e.g., while not processing a substrate). In some embodiments, the method 300 may be performed between process runs, during downtimes, scheduled maintenance, or the like. In some embodiments, the method 300 may be performed while substrates are being transferred to and from the processing equipment. For example, in embodiments where the method is utilized to monitor one or more parts of the processing system 100 or process chamber 112 described above, the method 300 may be performed during the period of time it takes for the vacuum robot 130 to transfer substrates 124 to and/or from the process chamber 112.

The method 300 begins at 302 where a test to be performed on a particular piece of processing equipment is selected from a list of possible tests that may be performed. In some embodiments, the list of possible tests that may be performed generally may comprise one or more different tests configured to monitor various aspects of the processing equipment. The tests may generally include any type of tests used to monitor the processing equipment to ensure continued functionality. For example, the tests may be used to detect, for example, process drift, calibration errors, component condition, or to predict routine or preventative maintenance need, or the like. In addition, the tests may be performed on any parts of the processing equipment that may require periodic monitoring or testing. For example, in embodiments where the tests are performed on a process chamber, the tests may be used to monitor RF or DC power sources, gas or coolant supplies, vacuum systems, endpoint detection systems, chamber pressure control systems, electrostatic or vacuum chuck systems, or the like.

In some embodiments, the tests may be limited to testing one or more components of the process chamber such that the total time to perform the test is as small as possible. For example, rather than construct a maintenance test that checks a large number of components and takes a large total time to perform, a test may be provided that checks a subset of components (or a single component) and that takes a lesser amount of time to perform. For example, in some embodiments, each test may have a minimum run time associated with the test. The minimum run time is the smallest amount of time it takes to run that particular test. Each test may further have a minimum increment time associated with the test. The minimum increment time is the smallest amount of time that the particular test can be subdivided into. Each test may further have a total run time associated with the test. The total run time is the amount of time it takes to run that particular test. In some embodiments, for example, where a test is not able to be broken into smaller pieces, the total run time and the minimum run time may be the same.

Each test may further have an interrupt time associated with the test. The interrupt time is the amount of time it takes to interrupt, or stop, that particular test. In some embodiments, the test may have a plurality of interrupt times associated with the test. For example, depending upon the progression of the test, the interrupt time may vary. For example, the amount of time it takes to stop a test and return a component being tested into a ready state may be different during an initialization phase of the test, a middle phase of the test, an ending phase of the test, or the like. As used herein, "interruptible" means that a test can be stopped without completion. However, not all services need to be interruptible. For example, a period of time will elapse from a pod, or substrate carrier, first reaching the factory interface to the point where a substrate from that pod is ready to go into a particular chamber. If a test can be completed in that period of time, then the test does not need to be interrupted. However, some tests can take longer than the period of time to complete. As such, those tests may be designed to be interrupted and to continue or restart next time. In addition, depending upon the nature of the test, some tests may be segmented—meaning that the test may be able to be restarted and continued from the interrupt point, rather than starting the entire test over from the beginning. For example, when testing a number of discrete points over a range of operation (such as a multipoint calibration test that may be performed on a pressure gauge at every few mTorr over a range of pressures), the test may be able to be picked up from where it was last interrupted. However, for tests that require a continuous span of time that may be longer than the available period of time for the test (for example, a calibration test for a mass flow controller may measure a stability of a pressure change over time), then those tests need to be restarted from the beginning each time that they are interrupted.

In some embodiments, the tests may be used to collect data points or measurements relating to the current performance of the process equipment. For example, the test may collect data and analyze one or more of a chamber or component temperature (such as the temperature of a substrate support pedestal, electrostatic chuck, or the like), an RF power delivered to the chamber (such as an RF source power or an RF bias power), RF harmonics, an electrical signal (such as a voltage, a current, a phase interaction, or the like), a gas flow rate of a gas introduced into the equipment (such as through a mass flow controller or the like), a pressure of an internal process volume of the equipment, or the like. In some embodiments, the test may be performed by recording sensor data (such as thermocouples, pressure sensors, electrical sensors, or the like). In some embodiments, the collected data points or measurements may be compared to data points or measurements of process equipment that is known or presumed to be in acceptable or optimized condition, one or more modeled measurements of equipment designated as ideal (e.g., a "golden chamber"), or combinations thereof, or the like.

In some embodiments, the list of possible tests may be listed in an arbitrary order and selected to run sequentially. In such embodiments, if the chosen test is not performed to completion (as discussed below) the test may be repeated at the next available opportunity, or in some embodiments, the test may be skipped and repeated after the remaining tests have been performed.

Alternatively, in some embodiments, each test in the list of tests may be assigned a level of priority and selected in order of priority given. The assigned level of priority of each test may be designated based on one or more factors or characteristics of each of the test, for example, a frequency, the length of time the test requires to complete (e.g., the run time), the importance of the test, or the like. For example, each test may be assigned a level of priority based on a predetermined minimum and maximum amount of times the respective test should be performed over a given period. For example, in some embodiments, one or more of the tests may be configured to run a minimum number of times over a given period (for example, once every twenty four hours) and/or a maximum number of times over a given period (for example, a maximum of once an hour). In such embodiments, a test that has not run the minimum amount of times may be assigned a higher priority than any remaining tests that have been performed at least the minimum number of times. In addition, the tests that are closest to the limit of not being run the minimum number of times may have a higher priority than test that also have not been run the minimum number of times, but that have a longer period of time before hitting or exceeding that limitation.

Alternatively or in combination, in some embodiments, additional factors may be taken into account when selecting the test from the list of possible tests. For example, in some embodiments, the predicted idle time of the processing equipment may be compared to the expected run time (or a minimum run time, as discussed below) for each test listed in the list of possible tests. In such embodiments, a test having a run time less than that of the predicted idle time of the processing equipment may be selected to run in place of a test having a run time greater than that of the predicted idle time of the chamber. In some embodiments, if no test on the list of possible tests has an expected run time of less than the predicted idle time of the processing equipment, no test may be selected to run. In such embodiments, an alert may be provided to the processing equipment operator to notify the operator a test cannot be run. The alert may be any type of alert capable of providing notice to the operator, for example, an audio alarm, light, data message, or the like.

In some embodiments, the selection criteria may also take into account any resources that may be shared amongst several pieces of processing equipments. For example, in some embodiments, the processing equipment being monitored may include multiple process chambers, such as a twin chamber processing system. For example, a first process chamber (which may be in a twin chamber processing system) may enter an idle state and be ready for testing while a second process chamber having a shared resource (which may be the second chamber in the twin chamber processing system) is in a processing state. As such, when the first process chamber enters the idle state, the selected test may not relate to the shared resource if the shared resource is currently busy due to processing in another chamber (e.g., rather than doing nothing while waiting for the shared service to become available, the next service that could be run may be selected, and the shared resource may be tested at the next opportunity).

Next at 304, the selected test begins. In some embodiments, the test generally begins when the processing equipment to be tested enters into an idle mode. For example, the test may begin immediately upon the processing equipment ending a process, or in some embodiments, the test may begin immediately upon the removal of a substrate within the processing equipment. In some embodiments, the test may begin after the processing equipment is already in an idle state. For example, upon meeting some other criteria such as the availability of a shared resource to be tested. The test may be stored in memory of a controller of one or more pieces of processing equipment (for example, as described above) and may be configured to run automatically, thereby eliminating the need for user input or manual initiation. In some embodiments, an override feature may be provided to prevent a selected test (or a subsequent selected test) from starting until the processing equipment is put back into production. For example, in some embodiments, prior to starting the subsequent selected test the override feature may prevent a subsequent selected test to be performed until after a substrate process is performed in the processing equipment.

Next, at 306, a comparison between the test run time and the equipment idle time is made. The comparison may be made at any time after the test is selected. For example, in some embodiments, the comparison between the test run time and the chamber idle time may be made prior to the test beginning at 304, or in some embodiments immediately upon the start of the test at 304, or in some embodiments, after the test begins. In some embodiments, the comparison may be made at set intervals while the test is being performed (e.g., periodically). Alternatively, or in combination, the comparison may be made continuously as the test is performed. In embodiments where the comparisons are made or continuously made after the beginning of the test, the comparison may compare a remaining or predicted remaining test run time to a remaining or predicted remaining chamber idle time.

Next, at 308, it is determined whether to end, or interrupt, the test. The determination may be made at any time necessary as to minimize the processing equipment down time. For example, in some embodiments, the determination may be made at any time after the selected test begins at 304. In some embodiments, in determining whether to end the test, certain factors may be considered such as, for example, the remaining amount of time left to run the test, the predicted amount of process equipment idle time, or the like. Alternatively or in combination, an event, such as a new substrate or a new lot of substrates to be processed in the process chamber arriving at the process chamber may also be a factor in considering whether to end the test. For example, if a new lot of substrates arrive at the process chamber, or the cluster tool, and if the substrates are to be processed in the chamber where the test is running, the test may be stopped to allow production to continue, as discussed below.

Figure 4:
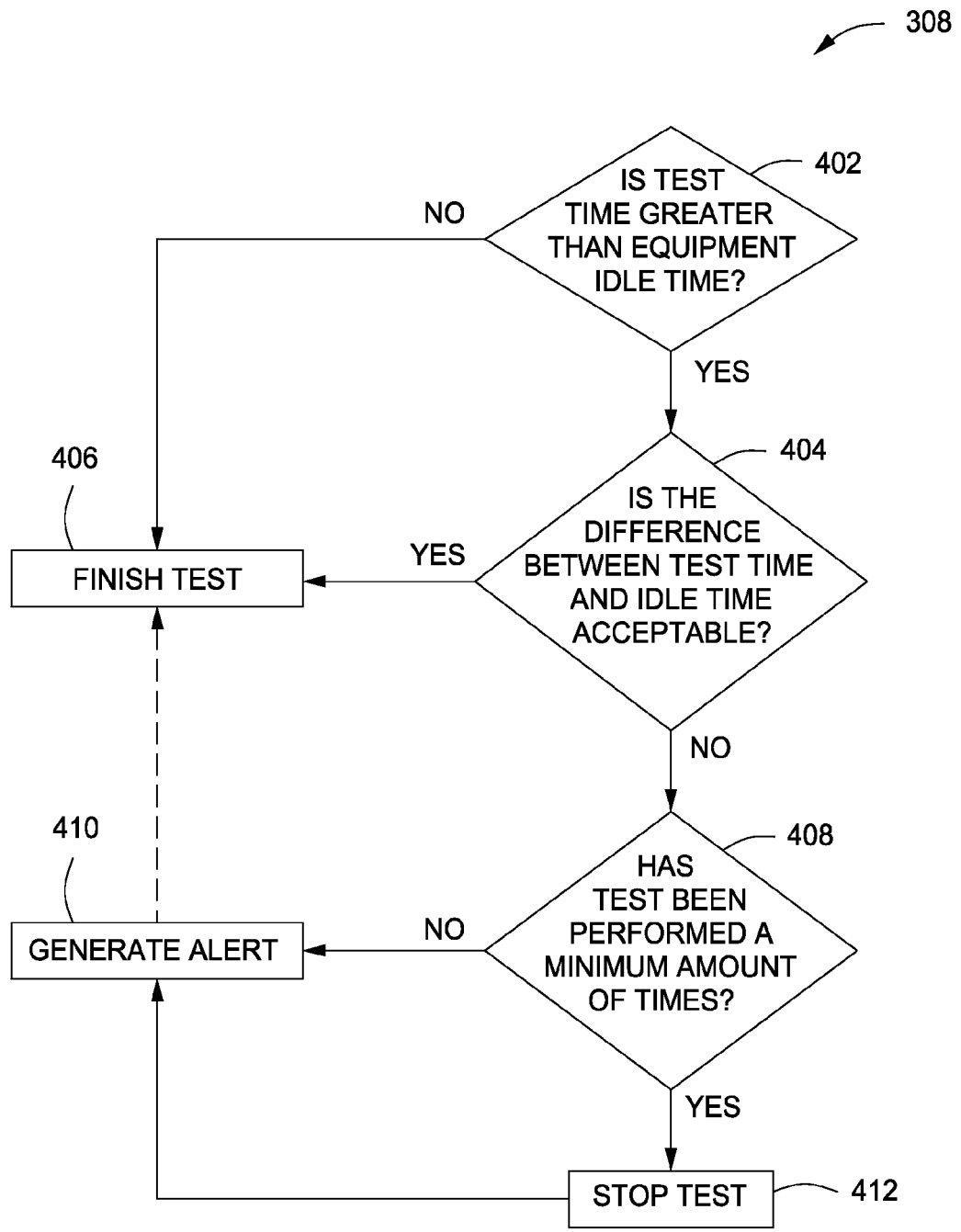

For example, referring to FIG. 4, the determination as to whether to end the test may include an inquiry as to whether the test time is greater than the equipment idle time, at 402. In such embodiments, the inquiry may be made at any time during the test, for example, at the beginning of the test, or during the test at set intervals, or continuously as the test progresses. In embodiments where the inquiry is made after the test begins, the inquiry may be made as to whether the predicted remaining test time is greater than the predicted remaining equipment idle time. The predicted remaining equipment idle time may be updated as necessary, for example, if a new substrate or lot of substrates arrives that is to be processed in the process chamber undergoing the test. If the remaining test time is less than or equal to the remaining equipment idle time, the test continues until it reaches completion and the method progresses to 406, where the test is finished.

However, if the test time is greater than the equipment idle time, the method progresses to 404 where an inquiry is made as to whether the difference between the test time and process equipment idle time falls within a range of an acceptable amount of time. The acceptable range of time may be a predetermined amount of time that the process equipment may remain idle, even though production may be impacted. If the difference between the test time and the process equipment idle time remains within the range of an acceptable amount of time the test progresses until completion and the method progresses to 406, where the test is finished.

However, if the difference between the test time and the process equipment idle time falls outside of the range of an acceptable amount of time the method progresses to 408 where an inquiry is made as to whether the test have been performed a minimum amount of times. The minimum amount of times the test is to run may be any predetermined amount. In some embodiments, the minimum amount of times the test is to run may be set based on a particular frequency, for example, a minimum amount per time unit, a minimum amount per substrates or lots of substrates processed, or the like.

If the test has not been run the minimum amount of times, the method proceeds to 410 where an alert is generated to notify an operator that the test has not been run the minimum amount of times within a given time period. The alert maybe any type of alert, for example, an audio alarm, visual notification such as a light, data message, or the like. In some embodiments, after the alert has been made at 410 the method may progress to 412, where the test stopped, or interrupted. If a test is stopped, the test returns to the queue, or list, of tests as if the test was never run. As such, the test may be selected again the next time the process chamber is idle and ready to be tested, in accordance with the test selection criteria discussed above. Alternatively, in some embodiments, after the alert has been made at 410, the test may continue to run until completion and the method progresses to 406, where the test is finished. For example, a test may be allowed to finish in situations where interrupting the test would result in poor subsequent processing results.

The above-described methods may be implemented in a number of ways. For example, in one non-limiting embodiment, a method for monitoring processing equipment may include performing, in order, (a) waiting for and processing incoming substrates in a process chamber; (b) if the process chamber is not currently running any substrates or performing any preliminary or post substrate processing, then determining whether there are any substrates to be processed in the process chamber; (c) if there are substrates to be processed in the process chamber, then returning to (a); (d) if there are no substrates to be processed in the process chamber, then upon determining if an idle time of the first process chamber is below a minimum idle time before test start or if there are no tests that are due to run, then returning to (b); (e) if there are no substrates to be processed in the process chamber, then, if an idle time of the process chamber is above a minimum idle time before a test start time, determining that the process chamber is idle and tests can be run; (f) selecting and starting a test selected from a list of a plurality of tests to perform on the process chamber when the process chamber is in an idle state for a period of time; (g) if there are substrates to process and the test is interruptible, then interrupting the test and returning to (a); (h) if there are substrates to process and the test is not interruptible, or if there are no substrates to process, then finishing the test; and (i) upon finishing the test, returning to (c). Other variations of the above example may be used to monitor processing equipment in accordance with the teachings provided herein.

As non-limiting examples of variations of the directly preceding embodiment, additional variations may include, wherein determining whether to end the selected test further comprises determining that the test has not been performed a minimum amount of times; and generating an alert to notify the test had not been performed a minimum amount of times. The method may further include, wherein the processing equipment comprises at least one of a cluster tool, processing system, load lock chamber or process chamber. The method may further include, wherein the idle time comprises an amount of time required to transport a substrate to and/or from processing equipment. The method may further include, wherein starting the test is performed automatically based upon the processing equipment being monitored entering the idle state. The method may further include, wherein the processing equipment being monitored includes a twin chamber processing system, and wherein a first process chamber in the twin chamber processing system enters the idle state and is tested while a second process chamber of the twin chamber processing system is in a processing state. The method may further include, an override feature to prevent tests starting until the chamber is put back into production. The method may further be embodied in a computer readable medium, having instructions stored thereon which, when executed, causes a controller to perform the method for monitoring processing equipment. Combinations of some or all of the preceding examples are contemplated.

Thus, methods for monitoring processing equipment have been provided. The inventive methods advantageously provide for monitoring processing equipment during process equipment idle time using interruptible tests that may be stopped upon the process equipment being needed to process additional substrates, thereby reducing downtime and increasing the efficiency of the processing equipment.

While the foregoing is directed to embodiments of the present invention, other and further embodiments of the invention may be devised without departing from the basic scope thereof.

The invention claimed is:

1. A method for monitoring processing equipment, comprising:
    (a) selecting, using one or more processors, a test from a list of a plurality of tests to perform on the processing equipment when the processing equipment is in an idle state for a period of time, wherein the test has a total run time;
    (b) starting the selected test;
    (c) comparing a remaining idle time of the period of idle time to a remaining run time of the total run time as the selected test is performed; and
    (d) determining whether to end the selected test prior to completing the total run time in response to the comparison.

2. The method of claim 1, wherein determining whether to end the selected test further comprises determining that the remaining idle time is less than the remaining run time, and, in response:
    (e) ending the selected test prior to the completion of the period of time;
    (f) upon determining that a difference between the remaining idle time and the remaining run time is greater than a predetermined acceptable amount of time, ending the selected test prior to the completion of the period of time;
    (g) upon determining that a difference between the remaining idle time and the remaining run time is less than a predetermined acceptable amount of time, ending the selected test upon reaching the total run time;
    (h) upon determining that a difference between the remaining idle time and the remaining run time is greater than a predetermined acceptable amount of time and further determining that the selected test has been performed a minimum amount of times, ending the test prior to completion of the period of time; or
    (i) upon determining that a difference between the remaining idle time and the remaining run time is less than a predetermined acceptable amount of time, and further determining that the test has not been performed a minimum amount of times, generating an alert to notify the test had not been performed a minimum amount of times.

3. The method of claim 2, wherein (i) further comprises: ending the test upon reaching the total run time.

4. The method of claim 1, wherein starting the test is performed automatically based upon the processing equipment being monitored entering the idle state.

5. The method of claim 4, wherein the processing equipment being monitored includes a twin chamber processing system, and wherein a first process chamber in the twin chamber processing system enters the idle state and is tested while a second process chamber of the twin chamber processing system is in a processing state.

6. The method of claim 1, further comprising:
    (e) determining whether the period of idle time is less than a predetermined amount of time; and
    (f) performing (a)-(d) if the period of idle time is less than the predetermined amount of time.

7. The method of claim 1, further comprising:
    (e) determining that a substrate is to be provided to the processing equipment for processing after starting the selected test but before ending the selected test upon reaching the total run time;
    (f) ending the selected test prior to completing the total run time; and
    (g) providing the substrate to the processing equipment to be processed.

8. The method of claim 1 wherein determining whether to end the selected test further comprises determining that the remaining idle time is greater than or equal to the remaining run time; and further comprising:
    (e) ending the selected test upon reaching the total run time.

9. The method of claim 1, further comprising:
    preventing a subsequent selected test to be performed until after a substrate process is performed in the processing equipment prior to starting the subsequent selected test.

10. The method of claim 1, wherein the idle time comprises an amount of time required to transport a substrate to and/or from processing equipment.

11. A non-transitory computer readable medium, having instructions stored thereon which, when executed, causes a controller to perform a method for monitoring processing equipment, comprising:
    (a) selecting a test from a list of a plurality of tests to perform on the processing equipment when the processing equipment is in an idle state, wherein the test has a total run time;
    (b) starting the selected test;
    (c) comparing a remaining idle time of a period of idle time to a remaining run time of the total run time as the selected test is performed; and (d) determining whether to end the selected test prior to completing the total run time in response to the comparison.

12. The non-transitory computer readable medium of claim 11, wherein determining whether to end the selected test further comprises determining that the remaining idle time is less than the remaining run time, and, in response:
   (e) ending the selected test prior to the completion of the period of time;
   (f) upon determining that a difference between the remaining idle time and the remaining run time is greater than a predetermined acceptable amount of time, ending the selected test prior to the completion of the period of time;
   (g) upon determining that a difference between the remaining idle time and the remaining run time is less than a predetermined acceptable amount of time, ending the selected test upon reaching the total run time;
   (h) upon determining that a difference between the remaining idle time and the remaining run time is greater than a predetermined acceptable amount of time and further determining that the selected test has been performed a minimum amount of times, ending the test prior to completion of the period of time; or
   (i) upon determining that a difference between the remaining idle time and the remaining run time is less than a predetermined acceptable amount of time, and further determining that the test has not been performed a minimum amount of times, generating an alert to notify the test had not been performed a minimum amount of times.

13. The non-transitory computer readable medium of claim 12, wherein (i) further comprises:
   ending the test upon reaching the total run time.

14. The non-transitory computer readable medium of claim 11, further comprising:
   (e) determining whether the period of idle time is less than a predetermined amount of time; and
   (f) performing (a)-(d) if the period of idle time is less than the predetermined amount of time.

15. The non-transitory computer readable medium of claim 11, further comprising:
   (e) determining that a substrate is to be provided to the processing equipment for processing after starting the selected test but before ending the selected test upon reaching the total run time;
   (f) ending the selected test prior to completing the total run time; and
   (g) providing the substrate to the processing equipment to be processed.

16. The non-transitory computer readable medium of claim 11, wherein determining whether to end the selected test further comprises determining that the remaining idle time is greater than or equal to the remaining run time; and further comprising:
   (e) ending the selected test upon reaching the total run time.

17. The non-transitory computer readable medium of claim 11, further comprising:
   preventing a subsequent test to be performed until after a substrate process is performed in the processing equipment prior to starting the selected test.

18. The non-transitory computer readable medium of claim 11, wherein the idle time comprises an amount of time required to transport a substrate to and/or from processing equipment.

19. The non-transitory computer readable medium of claim 11, wherein starting the test is performed automatically based upon the processing equipment being monitored entering the idle state.

20. A method for monitoring processing equipment, comprising, in order:
   (a) waiting for and processing incoming substrates in a process chamber;
   (b) if the process chamber is not currently running any substrates or performing any preliminary or post substrate processing, then determining, using one or more processors, whether there are any substrates to be processed in the process chamber;
   (c) if there are substrates to be processed in the process chamber, then returning to (a);
   (d) if there are no substrates to be processed in the process chamber, then upon determining if an idle time of the first process chamber is below a minimum idle time before test start or if there are no tests that are due to run, then returning to (b);
   (e) if there are no substrates to be processed in the process chamber, then, if an idle time of the process chamber is above a minimum idle time before a test start time, determining that the process chamber is idle and tests can be run;
   (f) selecting and starting a test selected from a list of a plurality of tests to perform on the process chamber when the process chamber is in an idle state for a period of time;
   (g) if there are substrates to process and the test is interruptible, then interrupting the test and returning to (a); and
   (h) if there are substrates to process and the test is not interruptible, or if there are no substrates to process, then finishing the test.

* * * * *

UNITED STATES PATENT AND TRADEMARK OFFICE
CERTIFICATE OF CORRECTION

PATENT NO.       : 8,473,247 B2                                Page 1 of 1
APPLICATION NO.  : 12/915260
DATED            : June 25, 2013
INVENTOR(S)      : James P. Cruse et al.

It is certified that error appears in the above-identified patent and that said Letters Patent is hereby corrected as shown below:

In the Claims

In column 16, line 9, Claim 17, after "subsequent" and before "test" insert
--selected--, In column 16, line 11, Claim 17, after "starting the" and before "selected"
insert -- subsequent--.

Signed and Sealed this
Twentieth Day of May, 2014

Michelle K. Lee
*Deputy Director of the United States Patent and Trademark Office*